(12) United States Patent
Schrödner et al.

(10) Patent No.: US 10,837,826 B2
(45) Date of Patent: Nov. 17, 2020

(54) UV DOSIMETER WITH COLOR CHANGE

(71) Applicant: THÜRINGISCHES INSTITUT FÜR TEXTIL- UND KUNSTSTOFF-FORSCHUNG E.V., Rudolstadt (DE)

(72) Inventors: Mario Schrödner, Rudolstadt (DE); Hannes Schache, Rudolstadt (DE); Lars Blankenburg, Kahla (DE); Gulnara Konkin, Rudolstadt (DE)

(73) Assignee: THUERINGISCHES INSTITUT FUER TEXTIL-UND KUNSTSTOFF-FORSCHUNG E.V., Rudolstadt (DE)

( * ) Notice: Subject to any disclaimer, the term of this patent is extended or adjusted under 35 U.S.C. 154(b) by 0 days.

(21) Appl. No.: 16/312,549

(22) PCT Filed: Jun. 30, 2017

(86) PCT No.: PCT/EP2017/066281
§ 371 (c)(1),
(2) Date: Dec. 21, 2018

(87) PCT Pub. No.: WO2018/002306
PCT Pub. Date: Jan. 4, 2018

(65) Prior Publication Data
US 2019/0120688 A1 Apr. 25, 2019

(30) Foreign Application Priority Data
Jun. 30, 2016 (DE) .................. 10 2016 007 932

(51) Int. Cl.
C09K 9/02 (2006.01)
G02F 1/1503 (2019.01)
(Continued)

(52) U.S. Cl.
CPC ............... G01J 1/429 (2013.01); C09K 9/02 (2013.01); G02F 1/1503 (2019.01); G02F 1/155 (2013.01);
(Continued)

(58) Field of Classification Search
CPC ..... C09K 9/02; G01J 1/50; G01J 1/429; G01J 1/08; G01J 1/42; H01L 27/305;
(Continued)

(56) References Cited

U.S. PATENT DOCUMENTS 3,710,115 A 1/1973 Jubb
4,428,050 A 1/1984 Pelligrino et al.
(Continued)

FOREIGN PATENT DOCUMENTS

DE 40 12 984 A1 10/1991
DE 9313246 U1 12/1993
(Continued)

OTHER PUBLICATIONS

International Search Report of PCT/EP2017/066281.
German Search Report, DE Application No. 10 2016 007 932.0.

*Primary Examiner* — David P Porta
*Assistant Examiner* — Fani P Boosalis
(74) *Attorney, Agent, or Firm* — ProPat, LLC; Cathy R. Moore

(57) ABSTRACT

The invention discloses a flexible, energy-self-sufficient UV dosimeter which optically indicates the absorbed dose on the basis of the intensity and duration of the irradiation via a color change. The invention contains one or more UV dosimeter modules. Exemplary UV dosimeter modules include at least one UV-sensitive photodiode (common electrode (11), hole conductor layer (21), UV absorber layer (22), cathode (23)) and an electrochromic element (common electrode (11), ion storage layer (12), electrolyte layer (13),
(Continued)

electrochromic layer made of redox active material (14), transparent electrode (15)), between which an insulator (4) and a conductor track (5) are arranged. The electrochromic element accumulates the charge generated by the UV-sensitive photodiode and indicates this by means of a color change. The UV dosimeter can be produced as an integrated circuit using thin-film technology by successively applying and structuring organic or inorganic functional layers.

18 Claims, 3 Drawing Sheets

(51) Int. Cl.
    *G01J 1/42* (2006.01)
    *H01L 51/00* (2006.01)
    *H01L 51/42* (2006.01)
    *H01L 27/30* (2006.01)
    *H01L 51/44* (2006.01)
    *G02F 1/1516* (2019.01)
    *G02F 1/155* (2006.01)
    *G02F 1/157* (2006.01)
    *G02F 1/161* (2006.01)
    *G02F 1/163* (2006.01)
    *G02F 1/15* (2019.01)

(52) U.S. Cl.
    CPC .......... *G02F 1/157* (2013.01); *G02F 1/15165* (2019.01); *G02F 1/161* (2013.01); *G02F 1/163* (2013.01); *H01L 27/305* (2013.01); *H01L 51/0036* (2013.01); *H01L 51/0037* (2013.01); *H01L 51/0046* (2013.01); *H01L 51/0097* (2013.01); *H01L 51/4253* (2013.01); *H01L 51/44* (2013.01); *H01L 51/442* (2013.01); *H01L 51/448* (2013.01); *G02F 2001/164* (2019.01); *G02F 2201/44* (2013.01)

(58) Field of Classification Search
    CPC ............. H01L 51/0037; H01L 51/0046; H01L 51/4253; H01L 51/44; H01L 51/442; H01L 51/448; G02F 1/1503; G02F 1/15165; G02F 1/155; G02F 1/157; G02F 1/161; G02F 1/163; G02F 2001/164; G02F 2201/44
    See application file for complete search history.

(56) References Cited

U.S. PATENT DOCUMENTS

2011/0003279 A1* 1/2011 Patel ........................ G01D 3/10
                                                                       435/5
2011/0065203 A1* 3/2011 Studer .................... C09D 11/50
                                                                      436/164

FOREIGN PATENT DOCUMENTS

| DE | 69102804 | | 11/1994 |
|---|---|---|---|
| DE | 43 17 405 | A1 | 12/1994 |
| DE | 10 2007 041395 | A1 | 3/2009 |
| DE | 10 2008 049 702 | A1 | 4/2010 |
| DE | 10 2013 113445 | A1 | 6/2014 |
| GB | 2 437 362 | A | 10/2007 |
| NL | 000001023984 | C | 1/2005 |
| WO | 86/03319 | A1 | 6/1986 |

* cited by examiner

UV DOSIMETER WITH COLOR CHANGE

CROSS-REFERENCE TO RELATED APPLICATIONS

This application is being filed under 35 U.S.C. § 371 as a National Stage Application of pending International Application No. PCT/EP2017/066281 filed Jun. 30, 2017, which claims priority to the following parent application: German Patent Application No. 10 2016 007 932.0, filed Jun. 30, 2016. Both International Application No. PCT/EP2017/066281 and German Patent Application No. 10 2016 007 932.0 are hereby incorporated by reference herein in their entirety.

FIELD OF THE INVENTION

The invention relates to a UV dosimeter based on a simple electronic circuit, consisting only of one or more UV dosimeter modules, which are in turn composed only of a UV photodiode and an electrochromic element, which displays the accumulated radiation dose as a function of exposure and time as a color change of the electrochromic elements. The electrochromic element in this case fulfils the function both of the charge accumulation and of the colored display of the dose. The dosimeter functions without an additional electricity source, for example batteries or solar cells. In one preferred embodiment, the UV dosimeter may be produced economically as a thin, flexible film dosimeter by means of printing and coating techniques. During use, it may be compactly applied directly on the exposed surfaces.

BACKGROUND OF THE INVENTION

Known UV dosimeters are often based on photochromic layers, which change their color when exposed to radiation. Such dosimeters can be produced economically as single-use articles in the form of small test strips.

In the case of purely visual evaluation, in practice only qualitative information was obtained by comparison with a reference color scale. By means of photometric evaluation, quantitative information is also obtained, but this requires an additional measurement process with a suitable measuring instrument. For dose determination in radiation-curing methods, in the printing and coating industry, for instance, such a system is available from the company Hönle AG under the name UV scan. This, however, is rather cumbersome in particular for portable applications in the leisure sector (for example outdoor activities) or in occupational safety and health in an exposed environment (building sites, agriculture). Since the color change is reversible, in the event of an interruption of the irradiation (for example temporary cloud cover) the coloration may change back, so that a dose determination is no longer possible. This is a clear disadvantage which limits use substantially to cases with continuous irradiation, for example industrial processes.

In contrast to photochromic UV dosimeters, known electronic dosimeters are based on a UV-sensitive component, for example a photodiode or a photoresistor. The latter is part of an electronic circuit which integrates the charge generated by the UV sensor over the measurement time and finally displays the measured dose. Examples may be found in U.S. Pat. Nos. 4,428,050 and 3,710,115, the specifications regarding the circuits having different levels of detail. In addition or as an alternative to measurement value display, the dosimeters may also be provided with an optical or acoustic warning function which is activated when a particular setpoint value is reached. These circuits are constructed with discrete components, and therefore cannot be produced compactly and economically to any desired extent, and above all not flexibly. Furthermore, they usually require an electricity supply (mains connection, battery, or the like).

WO 86/03319 describes an energy self-sufficient circuit for an electronic UV dosimeter having an electroacoustic warning function. The circuit contains an optical sensor, resistors, capacitors, a preamplifier, a comparator, switches, diodes, a piezo transducer and a solar cell for the energy supply. No information is given regarding production of the circuit. The circuit is located in a housing having a window, and is therefore likewise not thin, flexible and not in fact economical.

DE 69102804 describes another electronic dosimeter for gamma, UV, X- or particle radiation, based on a detector, a calendar clock, a memory, a microprocessor, an energy supply, a display and/or an alarm. The circuit is constructed with discrete components and may, for example, be integrated into a credit card. Utility Model G9313246.8 claims a UV dosimeter having a photodetector consisting of a semiconductor having a bandgap of more than 2.25 eV, an input device, a signal processor and an optical and/or acoustic output device. Further elements of this dosimeter may be: lenses, memory, solar cell for the energy supply, filter. This dosimeter can be miniaturized and, for example, integrated into credit cards, watches, spectacles, containers or clothing. Neither dosimeter, however, is flexible enough to be used as a film or foil dosimeter. Manufacture would furthermore not be sufficiently simple and economical for it to be used as a single-use article.

According to Patent GB 2437362 A, a photovoltaic element, the efficiency of which changes by photodegradation, is used for dose determination. The efficiency correlates with the absorbed dose, and is registered by a circuit (not described in detail) (claims 8 and 19). By way of example, multimeters, voltmeters, ammeters or source meters are mentioned, in which case it may be assumed that these are conventional electronic instruments which prevent a flexible and thin configuration as a film dosimeter. Electrochromic elements or LEDs are proposed as optical warning elements, or alternatively an acoustic signal.

DE 10 2013 113445 A1 discloses a UV dosimeter consisting of a UV measuring device, a data processing device, a visual output and/or a display. In claim 16, a solar cell or battery as an energy supply is furthermore specified as an additional element. No information is given regarding how a dose value is formed from the signal of the UV measuring device. This is presumably the task of the data processing device, which in turn is a static or mobile terminal (claim 8). The communication between the UV measuring device and the data processing device preferably takes place wirelessly, although the way in which this communication is specifically carried out is not indicated. The disclosed dosimeter having a terminal is not intended as a thin film dosimeter, but is fitted in a housing (claim 18). Aside from the incompletely described functionality, the specified dosimeter appears unsuitable as a possible model for possible manufacture by printing techniques, since manufacture would be very expensive because of the complexity.

DE 10 2007 041395 A1 describes an energy self-sufficient, thin, flexible and economical film dosimeter, which is produced as an integrated circuit of printed thin-film components on a flexible substrate. One disadvantage of this solution is that a multiplicity of different components (UV diode, solar cells, capacitors, transistors, display, acoustic alarm) are required, which places high specific demands on the circuit development and the manufacture by printing processes. By using the present invention, these manufacturing processes can be simplified greatly.

Summary of Advantageous Embodiments of the Invention

The object was therefore to provide a UV dosimeter which is as simple as possible and no longer has the described disadvantages of the prior art.

The object is achieved by a flexible, energy self-sufficient UV dosimeter that is also suitable for single use, which optically displays the absorbed dose by a color change as a function of intensity and duration of the exposure and time. It is characterized in that it consists of one or more UV dosimeter modules, each UV dosimeter module comprising two functional components, namely a UV-sensitive photodiode and an electrochromic element. The electrochromic element is an inherent part of the measuring circuit. It accumulates the charge generated by the UV-sensitive photodiode and displays it by a color change after a predetermined electrical charge density is reached.

DETAILED DESCRIPTION OF ADVANTAGEOUS EMBODIMENTS OF THE INVENTION

Figure 1:
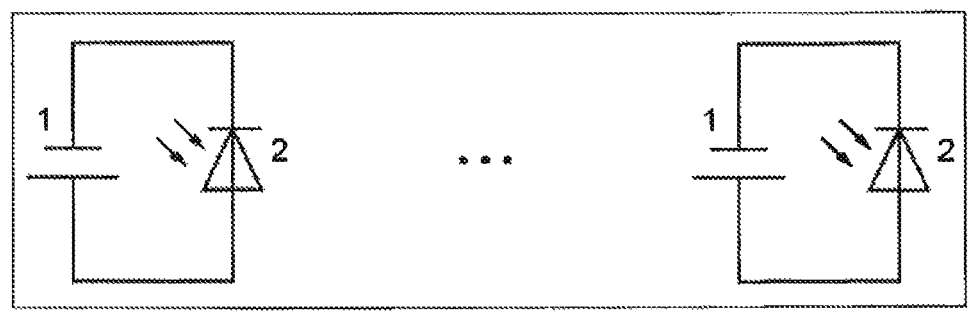
FIG. 1 is a block diagram of a plurality of UV dosimeters modules on a common carrier.

The UV dosimeter comprises at least one UV dosimeter module. The UV dosimeter module preferably comprises a common transparent electrode (11) and, arranged thereon, further layers of one or more UV photodiodes (2) and of the electrochromic element (1). The further layers of the UV-sensitive photodiode are preferably a layer (21) of a polymeric hole conductor material, a semiconducting UV absorber layer (22) and a cathode (23). The further layers of the electrochromic display element (1) are preferably an ion storage layer (12), an electrolyte layer (13), an electrochromic layer (14) of a redox-active material and a preferably transparent electrode (15). An insulator (4) is expediently located between the photodiode (2) and the electrochromic display element (1). The two electrodes (15, 23) are connected by an electrical conductor track (5).

The UV dosimeter is therefore based on a very simple electronic circuit for determining the dose of UV radiation which acts on a human or an object. The active parts are only one or more UV photodiodes and at least one electrochromic element, which displays the accumulated radiation dose as a function of exposure and time by a color change. The electrochromic element accumulates the charge generated by the UV photodiode during the measurement period and displays this as a color change. The dosimeter functions without an additional electricity source, for example batteries or solar cells. Because of the simplicity of the circuit, the UV dosimeter may, in a preferred embodiment, be produced economically by means of printing and coating techniques as thin, flexible film dosimeter, so that the advantages of a photochromic film dosimeter can be combined with those of an electronic dosimeter. During use, it may be compactly applied directly on the exposed surfaces. This, for example, is important in the case of sunbathing under natural or artificial sunlight, other leisure or working activities in the open air, or in technical processes in which UV-curing materials are processed. Furthermore, unlike in the case of photochromic dosimeters, different measurement ranges may be produced over a large sensitivity range by suitable dimensioning of the components, and the coloration can be reset by short-circuiting the EC cell, so that the dosimeter may also be used several times.

The object of the invention is therefore to overcome the disadvantages of existing electronic solutions, such as bulky and rigid structure due to discrete components, expensive manufacture because of high circuit complexity, and of existing photochromic dosimeters, such as restricted measurement range and only qualitative display, while preserving individual substantial advantages of existing solutions, such as flexibility and reversibility. The solution to the object of the invention is achieved by a simple circuit of low complexity for a UV dosimeter for determining the dose of UV radiation, which makes do without additional energy supply and can be produced economically by means of printing and coating techniques as a thin, flexible film dosimeter.

Specifically, the object is achieved in that the dosimeter is produced as an integrated circuit consisting of only two component types, namely UV photodiodes (2) and electrochromic display elements (1). The charge delivered by the UV photodiodes (2) under UV irradiation is accumulated by the electrochromic display elements (1) and controls their color change, which in turn allows graphical display of the dose value. The electrochromic display elements (1) thus fulfil a dual function as a charge store and color-changing display. The charge storage function is obtained by the large capacitance of more than 1 $\mu F/cm^2$ in combination with the reversible oxidation of the electrochromic material which takes place, so that the charges are bound. The time of the color change is proportional to the current and to the exposure time, and therefore to the accumulated charge, and is consequently a measure of the irradiated UV dose. Since a particular voltage is required for the switching of the electrochromic display element (1), a plurality of UV photodiodes (2) are optionally to be connected in series or parallel. By suitable electrical and geometrical dimensioning of the UV photodiodes (2) and electrochromic display elements (1), it is possible to produce different sensitivity ranges and parameters for the dosimeter. Possibilities for electrical dimensioning are provided, for example, by the choice of photoactive and/or electrochromic redox-active materials and their layer thicknesses. Geometrical dimensioning is possible with the choice of the area ratios of the UV photodiode (2) and electrochromic display element (1). Depending on requirements, one or more photodiodes connected in series or parallel may control an electrochromic element.

Because only two component types are used and these are constructed layerwise in individual functional layers, the complexity of the integrated circuit is low, so that the circuit development and its technical implementation is simple to carry out with printing and coating techniques. In particular, the number of functional materials required, and therefore the method steps required, are limited.

During production of the UV dosimeter according to the invention, the functional layers are printed from suitable solutions or dispersions onto the transparent electrode (11). Suitable printing methods are for example inkjet, screen, offset, intaglio or relief printing, or aerosol jet printing. As an alternative to printing, other coating techniques such as doctor bleeding, freefall coating, cast coating, dip coating, electrodeposition and spin coating may also be included. Possibly required inorganic layers may likewise be produced by means of nanoparticle dispersions, but also by vapor deposition or sputtering.

FIG. 1 represents a block diagram of a plurality of UV dosimeter modules on a common carrier (3). In one particularly preferred embodiment, the flexible carrier (3) and the transparent electrode (11) are identical. A UV dosimeter module consists of the combination of an electrochromic element (1) and one or more photodiodes (2) according to FIG. 3.

Figure 2:
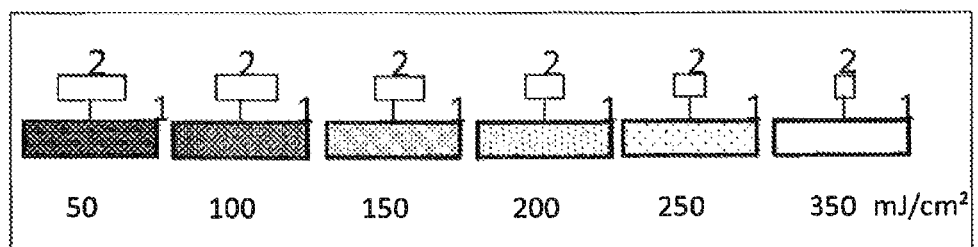
FIG. 2 is a diagram of an arrangement of UV dosimeters of different sensitivity.

FIG. 2 shows a diagram of an arrangement of UV dosimeters with different sensitivity; the different sensitivities are in this case achieved by varying the area of the UV photodiode (2), the sensitivity of the dosimeter increasing with an increasing area of the UV photodiode.

Figure 3:
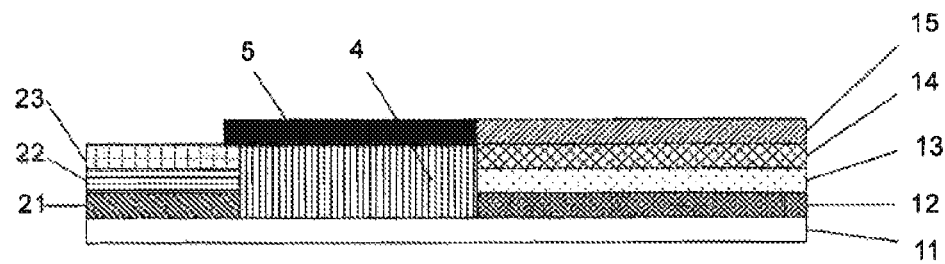
FIG. 3 is a schematic structure of a dosimeter module.

FIG. 3 represents the schematic structure of a dosimeter module. The dosimeter is produced by a layerwise application of the functional layers on a common transparent electrode (11); the functional elements of the UV photodiode (namely 11/21/22/23) are separated by an insulator (4) from the functional layers of the EC module (namely 11/12/13/14/15); the conductor track (5) connects the cathode (23) of the preferably transparent electrode (15). One of the outer layers of the dosimeter module is a conductive layer, the transparent electrode (11). The layers of the photodiode (2) and the layers of the electrochromic element (1) are positioned on the electrode (11), and the layers of the photodiode (2) and of the electrochromic element (1) are separated by an insulator (4) and bounded by an electrode (15, 23). These electrodes (15, 23) are connected by a conductor track (5). For the photodiode, the individual layers comprise the common electrode (11), a hole conductor layer (21), a semiconducting UV absorber layer (22) and a terminating cathode (23). The electrochromic element comprises the following layers: common electrode (11), ion storage layer (12), electrolyte (13), electrochromic layer of a redox-active material (14) and transparent electrode (15). If both the electrode (11) and the electrode (15) made of a transparent material, the additional effect of the display of the measured UV radiation dose means that the surface of the carrier could be seen through the electrochromic display element and then, for example, markings on the surface of the carrier 3 could then be revealed or concealed. For example, color scales which allow comparison with the display of the electrochromic element could be visible on the surface. If the cathode (23) and/or the electrode (15) are not transparent, then the transparent electrode (11) must face towards the light, or the observer. One UV photodiode (2) which is suitable in the scope of the invention is, for example, the bulk heterojunction diode having the layer structure transparent electrode/hole conductor/semiconducting UV absorber layer/cathode (FIG. 3), of which the semiconducting UV absorber layer (22) consists of a semiconducting conjugated polymer and a fullerene derivative. The conjugated semiconductor material should have a bandgap of more than about 3 eV, so that only UV light is absorbed. The transparent electrode (11) may, for example, consist of a thin layer of a transparent conductive oxide (for example indium tin oxide—ITO, ZnO, fluorine tin oxide—FTO) on a transparent and flexible substrate. The hole conductor (21) is, for example, a transparent conductive polymer such as polyethylene dioxythiophene doped with polystyrene sulfonic acid. The cathode (23) generally consists of aluminum, and may be applied both surface-wide and in a structured, for example comb-like fashion. A cathode (23) applied in a structured fashion has the advantage that light can pass through it.

An electrochromic display element (1) which is suitable in the scope of the invention consists of the electrodes (11) and (15), a redox-active polymer (14), an ion storage layer (12) and an electrolyte layer (13) (FIG. 3). The electrodes (11) and (15) again consist, for example, of a thin layer of a transparent conductive oxide (for example ITO, ZnO, FTO) on a transparent and flexible substrate. The ion storage layer (12) is, for example, a mixed oxide of $CeO_2$ and $TiO_2$. Depending on the desired color change, the redox-active polymer may for example be polyethylene dioxythiophene, poly-3-hexylthiophene or poly-TPD-4Me-DPX or any other suitable polymer. The electrolyte (13) consists a polymer gel and a conducting salt (for example $LiClO_4$).

One challenge in the circuit development consists in dimensioning the organic or polymeric UV photodiodes and the electrochromic display elements in such a way that the color change of the electrochromic display elements takes place with different dosage values. This requirement is solved by varying different parameters that influence the characteristic curves of the components, such as absorption coefficient, charge carrier mobility, layer thicknesses or areas. By using a plurality of differently dimensioned circuits according to the invention on a common electrode, different dose ranges can be covered. If, for example, a photodiode which delivers a current of 1 $mA/cm^2$ under full insolation is combined with an electrochromic display element which switches over fully with a charge density of 2 $mC/cm^2$, and an area ratio of the diode to the electrochromic display element of 1:500 is selected, then the time until full changeover of the color is 1000 s. If the electrochromic display element of each differently sensitive pairing is geometrically configured differently, i.e. as a number or as bars of different lengths, the respective dose value can thereby be represented quantitatively.

The entire circuit structure may, if required, be encapsulated by means of transparent high barrier layers or films.

For better adhesion on persons or objects, an adhesive layer may be applied to the rear side of the UV dosimeter, so that the sensor can be used in a similar way to an adhesive bandage or an adhesive tape.

The UV dosimeter according to the invention may be compactly applied in the form of a small test strip on the body, the clothing or objects. It is therefore, without causing interference there, advantageously located directly on the exposed surface and can thus measure the dose arriving there. If a plurality of areas of a body are exposed to different doses, each of the areas may be provided with a strip dosimeter. Here, small means an area of the flexible strip dosimeter of less than 10 $cm^2$, preferably less than 5 $cm^2$, and a total thickness of at most 250 μm, preferably less than 200 μm. Because of the low manufacturing costs, it is suitable for single use, although if required it may also be

Example 1

Figure 4A:
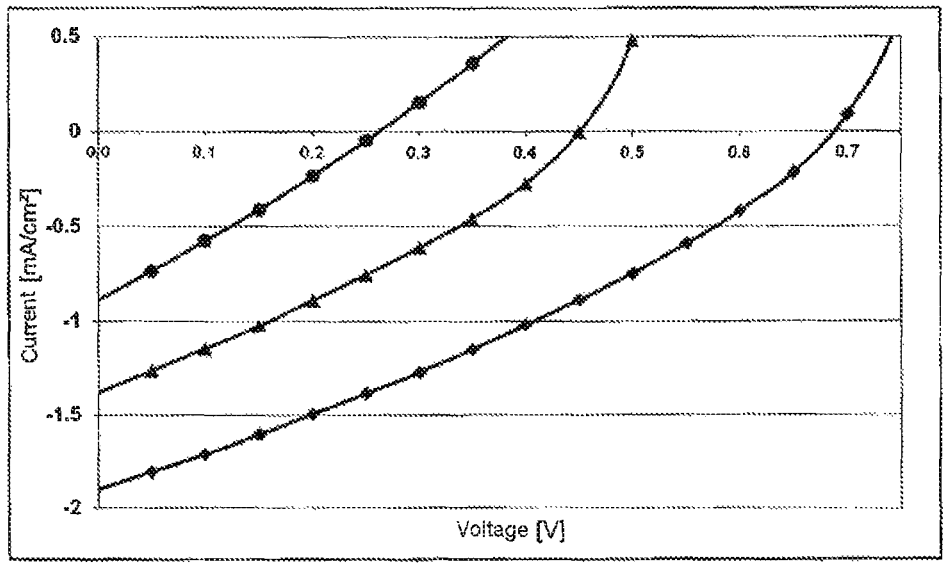
FIG. 4A is a characteristic current versus voltage curve of the UV-sensitive semiconductor materials according to Example 1.
Figure 4B:
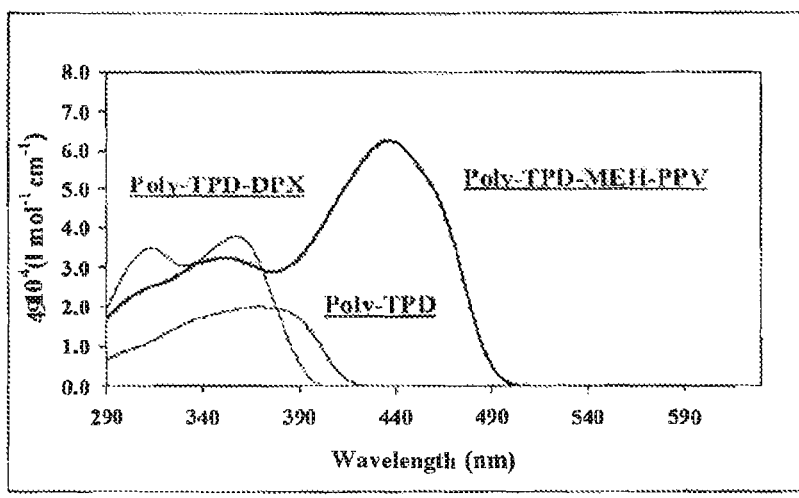
FIG. 4B is an absorption spectra of the UV-sensitive semiconductor materials according to Example 1.

This example shows different variants of the production of a UV-sensitive photodiode (FIG. 3). The layer structure of the photodiode (11/21/22/23) is ITO/polyethylene dioxythiophene:polystyrenesulfonic acid/polytriphenylamine derivative:[6,6]-phenyl-$C_{61}$-methyl butyrate/aluminum, the polytriphenylamine derivatives being poly-4'-butyl-triphenylamine-4,4'-diyl (poly-TPD), poly-4-methyl-triphenyl-diamine-diphenyl-p-xylylidene (poly-TPD-DPX) and poly[, 4-phenylene-(4-methylphenyl)imino-4,4'-diphenylene-(4-methylphenyl)imino-1,4-phenylenevinylene-2-methoxy-5-(2-ethyl-hexyloxy)-1,4-phenylene-vinylene] (poly-TPD:MeH-PPV). On exposure to sunlight with a sun simulator (1 kW/m$^2$, AM 1.5), the photodiodes generate current densities of between 0.5 mA/cm$^2$ and 1.5 mA/cm$^2$, depending on the position of the working point (FIG. 4A). Spectroscopic measurements show an absorption predominantly in the UV range ($\lambda$<400 nm) (FIG. 4B).

Example 2

Figure 5:
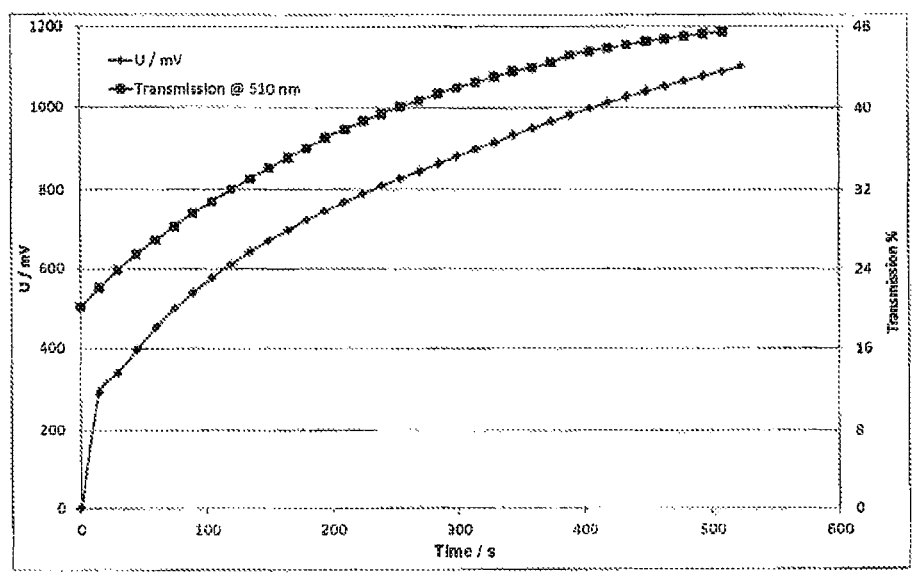
FIG. 5 is a graph of the variation as a function of time in the voltage and the optical transmission at a wavelength of 510 nm of the electrochromic element of a UV dosimeter according to Example 2.

This example demonstrates the color change of an electrochromic module (1) due to the current generated in a UV diode module (2). The circuit corresponds to the circuit diagram in FIG. 1. The layer structure (11/21/22/23) of the UV diode module is ITO/polyethylene dioxythiophene:polystyrene sulfonic acid/poly-3-hexyl-thiophene:[6,6]-phenyl-$C_{61}$-methyl butyrate/aluminum. The UV diode module consists of 5 diodes connected in series, which generate an open-circuit voltage of 1.85 V on exposure to UV light. The layer structure (11/12/13/14/15) of the electrochromic module is FTO/poly-3-hexylthiophene/polymer electrolyte/titanium dioxide:cerium oxide/FTO. The ratio of the area of the UV diode module to the area of the EC module is 1:1.5. The UV diode module was exposed to UV light with the wavelength 300-400 nm (maximum at 352 nm) with an exposure power of 500 μW/cm$^2$. A current flows because of a voltage is set up across the EC module (FIG. 5). At the same time, the transmission increases in the wavelength range of from 400 nm to 600 nm and decreases in the wavelength range of from 600 nm to 800 nm. This leads to a color change from violet to gray, which can also be visually detected clearly after about 5 minutes. The increase in the transmission at 510 nm is represented in FIG. 5. The radiation dose required for the color change is 150 mJ/cm$^2$. By varying the area ratio, the dose required for the color change can be shifted in a wide range both to smaller and larger values.

LIST OF REFERENCES 1 electrochromic display element
2 UV photodiode or UV photodiode module
3 carrier
4 insulator
5 conductor track
11 transparent electrode
12 ion storage layer
13 electrolyte
14 electrochromic layer of a redox-active material
15 electrode
21 hole conductor
22 semiconducting UV absorber layer
23 cathode Number of Figures Attached: 6

FIG. 1: block diagram of a plurality of UV dosimeter modules on a common carrier (3);
FIG. 2: diagram of an arrangement of UV dosimeters of different sensitivity;
FIG. 3: schematic structure of a dosimeter module;
FIGS. 4 A and B: characteristic curves of UV diodes and associated absorption spectra of the UV-sensitive semiconductor materials according to Example 1; and
FIG. 5: variation as a function of time in the voltage and the optical transmission at a wavelength of 510 nm of the electrochromic element of a UV dosimeter according to Example 2.

The invention claimed is:

1. A flexible, energy self-sufficient UV dosimeter which optically displays the absorbed dose by a color change as a function of intensity and duration of the exposure, and which can function without an additional energy source
   wherein said dosimeter consists of one or more UV dosimeter modules, each UV dosimeter module comprising one or more UV-sensitive photodiode(s) and an electrochromic element, which are arranged on a common electrode, and the electrochromic element accumulates the charge generated by the UV-sensitive photodiode and displays this accumulated charge by a color change.

2. The UV dosimeter as claimed in claim 1, wherein the common electrode is a layer of a transparent metal oxide on a transparent flexible substrate, on which further layers are arranged,
   with the further layers of the UV-sensitive photodiode being a layer of a polymeric hole conductor material, a semiconducting UV absorber layer and a cathode;
   the further layers of the electrochromic element being an ion storage layer, an electrolyte layer, an electrochromic layer of a redox-active material and an electrode; and
   an insulator being located between the photodiode and the electrochromic display element and the two electrodes being connected by an electrical conductor track.

3. The UV dosimeter as claimed in claim 1, wherein said dosimeter comprises a plurality of UV-dosimeter modules having different sensitivities.

4. The UV dosimeter as claimed in claim 3, wherein the sensitivity variation is carried out by varying the UV photodiode and/or the electrochromic element active area.

5. The UV dosimeter as claimed in claim 3, wherein the sensitivity variation is carried out by varying photoactive materials in a photoactive layer and/or redox-active materials in the electrochromic layer and/or a thickness of layers having active materials.

6. The UV dosimeter as claimed in claim 1, wherein the dosimeter can be reset into an initial state by electrical short-circuiting of the electrochromic element.

7. The UV dosimeter as claimed in claim 1, wherein said dosimeter is no larger than 10 cm$^2$.

8. The UV dosimeter as claimed in claim 1, wherein the dosimeter is provided with an adhesion layer, and/or an entire circuit structure, consisting of the electrochromic element and the photodiode, is encapsulated by transparent high-barrier layers or films.

9. The UV dosimeter as claimed in claim 1, wherein the UV-sensitive photodiode has a layer structure: transparent electrode/hole conductor/semiconducting UV absorber layer/cathode.

10. The UV dosimeter as claimed in claim 9, wherein the semiconducting UV absorber layer comprises a semiconducting conjugated polymer and a fullerene derivative, and the conjugated semiconductor material has a bandgap of more than 3 eV, the transparent electrode comprises a thin layer of a transparent conductive oxide, the hole conductor comprises a transparent conductive polymer and the cathode consists of aluminum.

11. The UV dosimeter as claimed in claim 1, wherein the electrochromic display element comprises two transparent electrodes, an electrochromic layer having a redox-active polymer, an ion storage layer and an electrolyte.

12. The UV dosimeter as claimed in claim 11, wherein the electrodes consist of a thin layer of a transparent conductive oxide, the ion storage layer is a mixed oxide of $CeO_2$ and $TiO_2$, the redox-active polymer of the electrochromic layer is a polyethylene dioxythiophene, poly-3-hexylthiophene or poly-TPD-4Me-DPX, and the electrolyte comprises a polymer gel and a conducting salt.

13. A method for producing a UV dosimeter as claimed in claim 2, comprising producing the transparent common electrode and all layers arranged thereon of the UV photodiode, and of the electrochromic display element, as well as the insulator located between the photodiode and the electrochromic display element and the conductor track connecting the two electrodes and, as integrated circuits by thin-film techniques by successive application and structuring of organic or inorganic functional layers.

14. The UV dosimeter as claimed in claim 7, wherein said dosimeter is no larger than 2 $cm^2$.

15. The method for producing a UV dosimeter as claimed in claim 13, wherein the UV photodiode comprises a hole conductor, a semiconducting UV absorber layer and a cathode; the electrochromic display element comprises an ion storage layer, an electrolyte layer, an electrochromic layer of a redox-active material and a transparent electrode, all of which are produced as integrated circuits by thin-film techniques by successive application and structuring of organic or inorganic functional layers.

16. The UV dosimeter as claimed in claim 1, wherein said dosimeter comprises an ion storage layer.

17. The UV dosimeter as claimed in claim 1, wherein the color change is imparted by a reversible oxidation of an electrochromic material.

18. The UV dosimeter as claimed in claim 17, wherein the color changes after a predetermined electrical charge density is reached.

* * * * *